United States Patent [19]

Desilets et al.

[11] Patent Number: 4,826,564
[45] Date of Patent: May 2, 1989

[54] METHOD OF SELECTIVE REACTIVE ION ETCHING OF SUBSTRATES

[75] Inventors: Brian H. Desilets; Richard D. Kaplan; Harbans S. Sachdev; Krishna G. Sachdev, all of Wappingers Falls; Susan A. Sanchez, Glenham, all of N.Y.

[73] Assignee: International Business Machines Corporation, Armonk, N.Y.

[21] Appl. No.: 115,140

[22] Filed: Oct. 30, 1987

[51] Int. Cl.$^4$ .............................................. B05D 3/06
[52] U.S. Cl. ............................... 156/643; 156/659.1; 156/660; 156/646; 156/662; 156/668; 156/661.1; 156/904; 430/314; 430/313; 437/245; 437/229; 427/41
[58] Field of Search .................... 156/661.1, 643, 668, 156/660, 662, 646, 659.1, 904; 427/41, 96; 430/314, 313; 437/187, 229, 231, 245, 944

[56] References Cited

U.S. PATENT DOCUMENTS 4,493,855  1/1985  Sachdev et al. ........... 204/192.32 X
4,539,049  9/1985  Cohen ............................ 106/287.17

*Primary Examiner*—David L. Lacey
*Assistant Examiner*—Thi Dang
*Attorney, Agent, or Firm*—William N. Hogg; Ira David Blecker

[57] ABSTRACT

A method of image transfer transfer into a substrate by reactive ion etch technique is provided. A mask layer on said substrate is formed by a spin-on film which film is comprised of a mixed organo-functional zircoaluminate or zircotitanate material. The film is dried and cured, and thereafter coated with a radiation sensitive resist. The reist is imagewise exposed and developed, which developing preferably also removes the pattern in the mask exposing the substrate. The substrate is then reactive ion etched, the remaining film acting as a barrier material to the etching.

12 Claims, 3 Drawing Sheets

↓ SPIN APPLY BARRIER LAYER AND BAKE/CURE

↓ SPIN APPLY RESIST AND DRY/BAKE

↓ EXPOSE

↓ DEVELOP PATERN IN RESIST AND BARRIER LAYERS

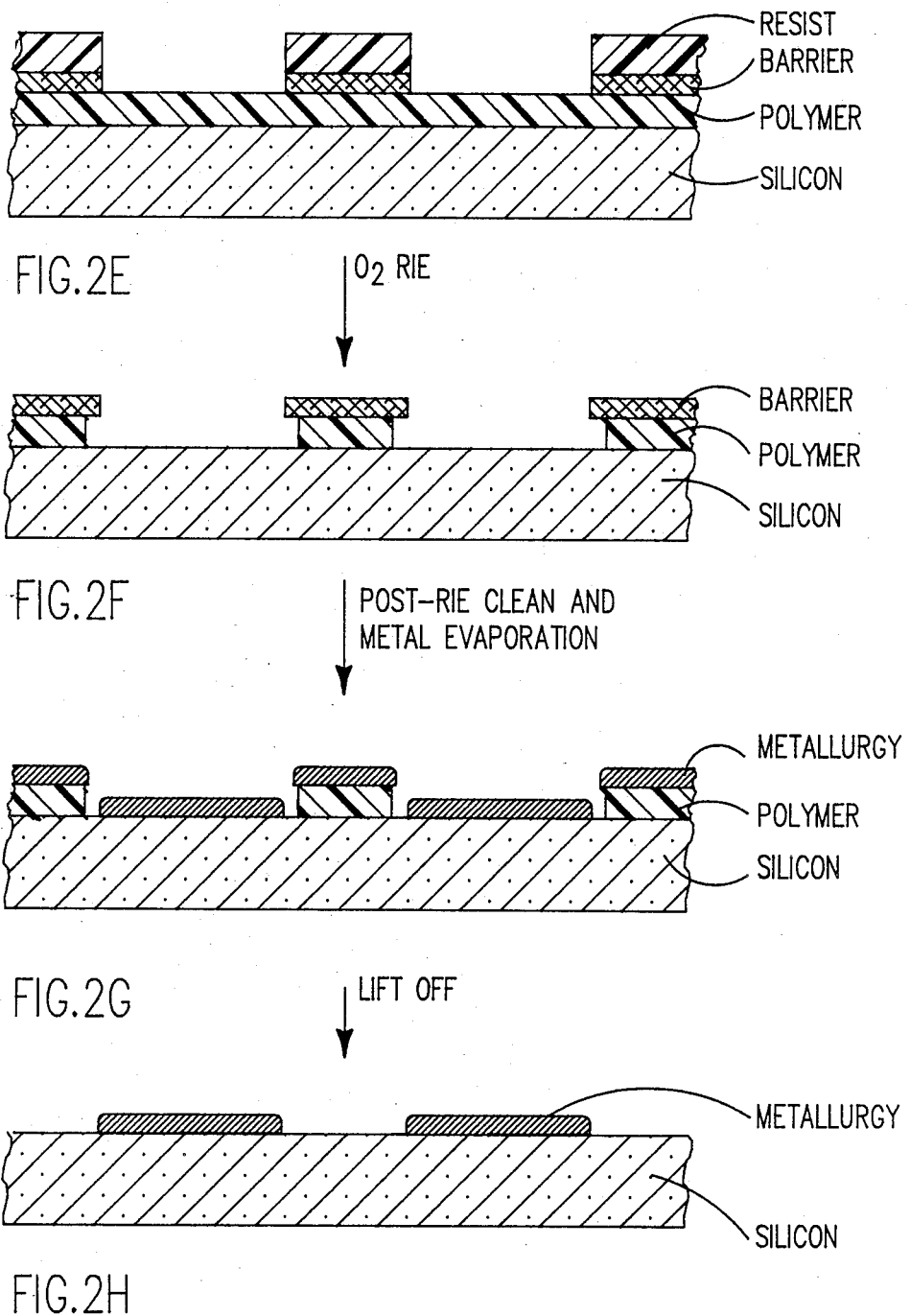

METHOD OF SELECTIVE REACTIVE ION ETCHING OF SUBSTRATES

BACKGROUND OF THE INVENTION

This invention relates generally to reactive ion etching (RIE) of substrates and to materials used in the etching process, and more particularly to an improved process for selective reactive ion etching of substrates such as organic polymers, or silicon utilizing an improved etch barrier material for forming the pattern on the substrate to be etched.

PRIOR ART

Reactive ion etching is a conventional practice which employs a variety of gases including $O_2$, $CF_4$ plus $O_2$, $CF_4$ and other fluorocarbons, and/or other gases depending on the material to be etched. For example, in fabrication of silicon based MOS devices, the etching takes the form of etching trenches in a silicon or polysilicon substrate. This is commonly done utilizing fluorine-containing gases such as $CF_4$ plus $O_2$, $SF_6$, $CCl_2CF_2$, $CFCl_3$ etc. In other cases, reactive-ion-etching is a preferred method for pattern transfer into organic polymer underlayers such as baked Shipley AZ1350J, or soluble polyamide/polyimide films overlying an underlying material to form a pattern for metallization on the underlying material, after which metallization is performed. After metallization, the remaining polyamide/polyimide material along with overlying stack of mask and blanket metal is removed by conventional lift-off processes leaving a pattern of conductive metal lines. This method of metallization is commonly referred to as "Expendable Mask Method".

In either case, it is necessary to provide a reactive-ion-etch (RIE) mask or film of barrier material over the substrate to be etched which can be selectively patterned to expose the substrate in the desired pattern to be etched.

Among the conventional RIE barrier materials for etching silicon substrates, some are deposited by evaporation or sputtering as in the case of MgO, $SiO_2$, $Al_2O_3$ and $MgF_2$, etc. Some of the commonly encountered problems in these films are lack of thickness uniformity and presence of high level of defects, and many standard mask materials such as $SiO_2$, $Si_3N_4$ and organic polymers have a low etch rate ratio vis-a-vis the silicon substrate being etched and thus have to be used as relatively thick layers for deep silicon trench etching.

For pattern transfer into organic underlayer using RIE technique, the spun-on "glass resin", or polydimethylsiloxane resin layers are commonly known to have $O_2$ RIE barrier applications. For improved properties of RIE mask in modified lift-off schemes, use of plasma polymerized organo-silicons as $O_2$ RIE barrier films has been disclosed in U.S. Pat. Nos. 4,493,855, 4,499,243, and 4,562,091. While organosilicons derived films have good $O_2$ RIE resistance, which makes them useful for etching pattern into organic substrates, they are less effective as mask in processes requiring deep silicon trench etching with $SF_6$, fluorocarbons or other halogenated hydrocarbon etchants. Also, the spin-on glass-resin formulations based on methylsiloxanes require special careful substrate preparation for proper adhesion, show some tendency toward cracking when cured at high temperatures, and have a tendency to form gels which is the major cause of defects in the solution coated films. Furthermore, these films in general are patterned only by dry etching as is the case with MgO and $MgF_2$.

Alumina spin-on "glass" compositions which can be wet developed, recently described by J. Gobrecht and M. Rossinelli, "Proceedings of the Electrochemical Society", Vol 85-1, pp 235-243, 1985 proceedings of the 5th symposium on Plasma Processing, edited by G. S. Mathad, G. C. Schwartz and G. Smolinsky are based on aluminum alkoxides and aluminum chelates, derived from beta-diketones and beta-ketoesters, such as aluminum acetyl acetonate or aluminum ethyl aceto acetate. Solutions of these materials in hexane can be spin applied to form thin films which upon proper bake/cure can be used as effective RIE mask; however, they have several serious drawbacks. First, solutions of these materials are extremely sensitive to humidity and consequently require extremely closely controlled conditions for spin or spray application; and the coatings have very poor mechanical Properties and invariably result in cracking and other defects upon high temperature curing. Although these types of coatings, are soluble in aqueous base developer solutions typically used in the lithographic processes utilizing diazonaphthoquinone-novolak resin based resist materials and thus the developing of the resist and patterning of the underlying barrier film to expose the substrate can be done in a single step, it is observed that the dissolution rate is relatively difficult to control resulting in severe undercutting.

Thus, while these Spin-on alumina type films do have the necessary RIE resistance for deep silicon trench etching and some process benefits over the dry sputtered coatings, the cracking problems, and sensitivity to humidity and excessive base solubility are serious drawbacks which limit their usage in microelectronics for fabrication of high density IC devices.

SUMMARY OF THE INVENTION

An improved reactive-ion-etch mask derived from mixed-metal organo-metallic compositions with specific reference to organo zircoaluminate polymers, organo hafniumaluminates, or organo zircotitanate polymers and a process of using the same is provided to form a stable, uniform, essentially defect-free etch barrier in the dry processes for selective pattern transfer into organic and inorganic substrates. In one particular aspect, these polymers are selected to be soluble in aqueous base developers such as those for the Shipley AZ-type resist materials commonly employed in photo lithography, and hence a single step development will remove both the patternwise exposed resist and the underlying barrier material to expose the substrate for pattern transfer by reactive ion etching.

DESCRIPTION OF THE DRAWINGS

FIGS. 2a through 2h show the step-wise processing of reactive ion etching of an organic substrate and subsequent metallization and lift off to form metal pattern onto substrates according to this invention.

DESCRIPTION OF THE PREFERRED EMBODIMENT

In reactive ion etching, a mask of barrier material with resistance to the etch medium is formed over the substrate which is to be etched and the barrier is patterned, preferably by applying an imageable coating as a resist material over the etch barrier, patternwise exposing the resist to appropriate source of radiation such as ultraviolet light, then developing the exposed resist region and at the same time transferring pattern into the underlying barrier film corresponding to the pattern on the resist to expose the substrate material corresponding to the pattern developed on the resist. The exposed underlying substrate material is then reactive ion etched while first the remaining resist film and then the barrier film (as the resist etches away during the RIE process) acts as a mask during the process of pattern replication into the substrate material by the RIE technique. Alternatively, the resist film is selectively removed with organic solvents or by $O_2$ RIE to resist end-point without affecting the mask pattern in which case the mixed-metal organometallic mask alone is a barrier throughout the RIE process. While there are many different applications and variations of such processes, two particular applications of RIE mask are especially suited for this invention. One of them is silicon trench etching for fabrication of semiconductor devices which is depicted in FIGS. 1a through 1d, and the other is in the multi-layer resist processes which involve reactive ion etching into polymer films overlying an organic or inorganic base material for the purpose of forming metal pattern over or into the base material as is shown in FIGS. 2a through 2h.

Figure 1A:
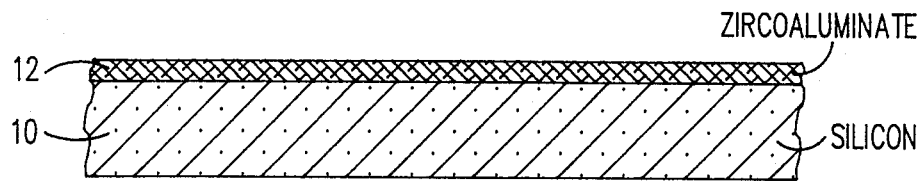
FIGS. 1a through 1d show step-wise processing for silicon trench etching according to this invention.
Figure 1B:
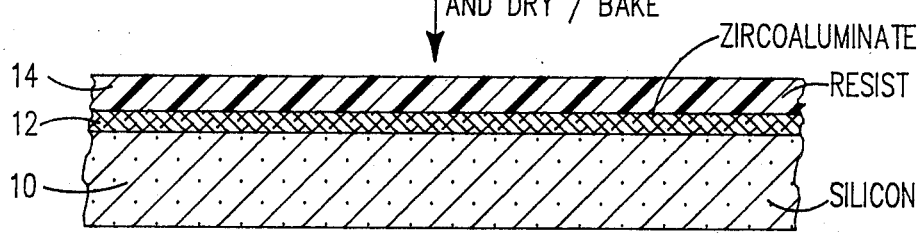
Figure 1C:
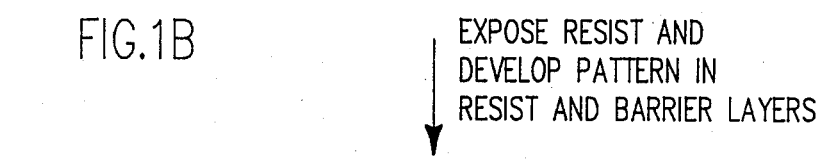
Figure 1D:
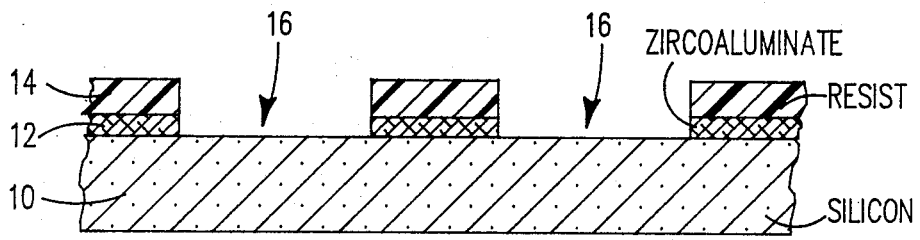
Figure 2A:
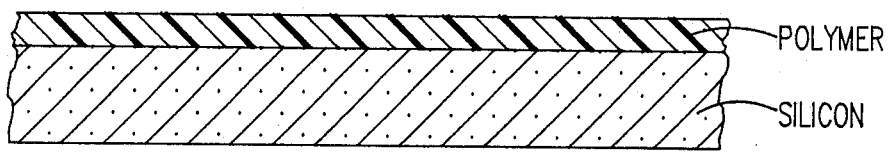
Figure 2B:
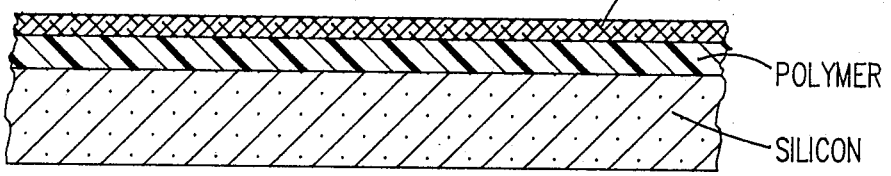
Figure 2C:
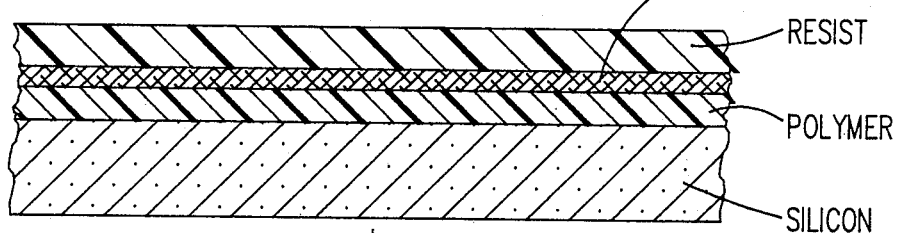
Figure 2D:
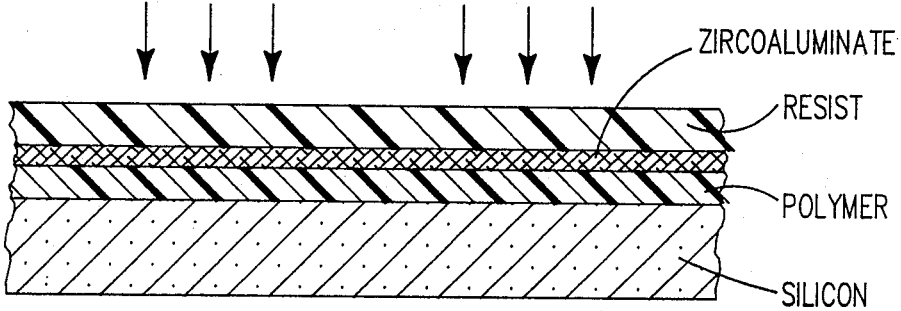

Referring now to FIGS. 1a through 1d, a silicon substrate 10 is shown which has coated thereon a film or barrier material 12, which is resistant to reactive ion etching as shown in FIG. 1a. A resist coating 14 is applied over the barrier material 12 as shown in FIG. 1b which resist coating is sensitive to selected radiation such as UV, and then pattern-wise exposed to radiation, followed by the solvent developing process which according to this invention preferably also removes the underlying barrier material 12 following the removal of the exposed resist material 14 to form the pattern 16 through both layers exposing the underlying silicon substrate 10 as shown in FIG. 1e. Alternatively, the resist and underlying barrier material may be developed separately where the resist is first developed in an organic solvent without affecting the underlying mask and thereafter, the mask is patterned to expose the substrate to be etched. The silicon substrate can then be reactive ion etched to form the desired trenches 18 therein as shown in FIG. 1d, the barrier material 12 acting as a mask to the underlying unexposed substrate material 10. The reactive ion etching can be done with the patterned resist material 14 initially remaining over the barrier pattern 12, or if desired, the resist film after pattern transfer into the mask layer may be removed by conventional means (selective removal by solvents or $O_2$RIE) before reactive ion etching to transfer pattern into silicon/polysilicon substrate as shown in FIG. 1d.

According to this invention, the non-errodable RIE mask materials for application by spin, spray, or dip coating are based on double metal alkoxide chemistry with particular reference to the Zircoaluminates, Hafnium-aluminum organo metallics, Zircotitanates and Magnesium Aluminates. General methods of preparation and properties of this class of materials are available in the literature on Inorganic plymers, e.g., "Metal Alkoxides", by D. C. Bradley, R. C. Mehrotra and D. P. Gour, Academic Press, 1978, Chapter 5; also, "Inorganic Polymers", Edited by F. G. A. Stone and W. A. G. Graham, Academic Press, 1962.

One method of preparation of mixed-metal organometallics such as Zircoaluminates involves reaction of aluminum alkoxides with other metal alkoxides to form any desired series of complexes:

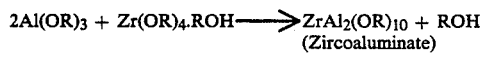

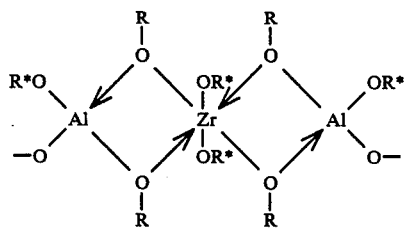

The molecular complexity of these materials in solutions depends on the nature of the R group. The alkoxy groups marked as OR* which are non-bridging groups are known to be readily replaceable by alternate ligands such as glycols or dihydroxyalcohols which include ethylene glycol, poplyene glycol, and 1,2 dihydroxy propane, etc, organic acids, alpha-hydroxy acids such as lactic acid and its higher homologs, preferably $C_2$ to $C_{10}$, amino acids, or alkanolamines such as ethanolamine to provide a series of derivatives. These materials can be used to form thin films on a variety of substrates for application as RIE barrier according to this invention.

A method for the preparation of the Zirconium alkoxide component starting with Zirconium oxychloride hydrate has been described in the literature as follows

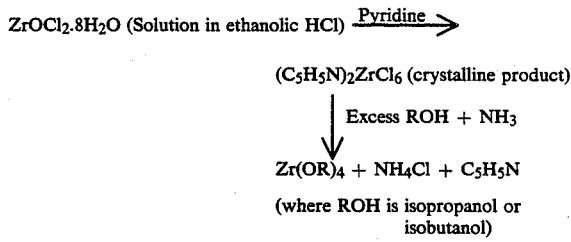

Ref. (D. C. Bradley, F. M. A. Halim, E. A. Sadek and W. Wardlaw, J. Chem. Soc., 2032 (1952)

The Aluminum alkoxide component also has a highly complex polymeric structure due to the tendency of the metal to achieve maximum coordination number as represented by the following:

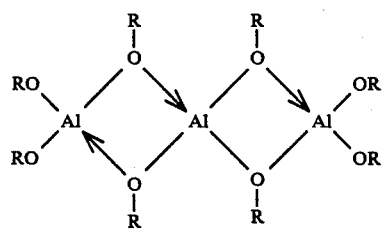

Similarly complexed structures can be written for Titanium alkoxides but molecular complexities are higher in the case of Zirconium containing compounds. These mixed metal organometallics especially the double-metal alkoxides such as zircoaluminates have been found to be useful as barrier layers according to this invention. Other mixed metal organo-metallics for application according to this invention include organo zircotitanates, organo hafniumaluminate complexes and magnesium aluminates. In addition to the literature references cited above which provide details of the chemistry including methods of preparation, structural complexities and properties of this class of materials, the zircoaluminates have also been disclosed by Cohen in U.S. Pat. Nos. 4,539,048 and 4,539,049, both assigned Jos. Cavedon Co., Inc., for the specific applications of these materials as adhesion promoters, coupling agents or inorganic filler surface modifiers. Preparation of the materials according to Cohen patents involves reacting zirconium oxychloride hydrate ($ZrOCl_2 \cdot 8H_2O$) with aluminum chlorohydrate ($Al_2(OH)_5Cl$) complex to generate a zirconium-aluminum containing backbone of the general structure:

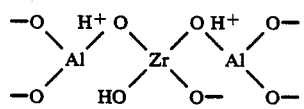

(A)

When treated with any one of several organo-functional complexing agents there is ligand transfer and co-ordinate covalent complexation to form organo zircoaluminate polymer as shown in B.

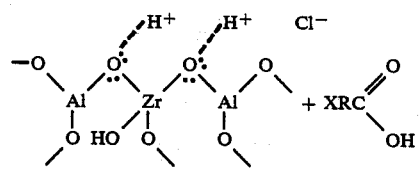

(B)

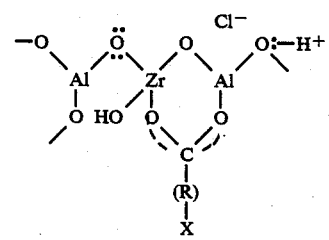

wherein R is an organo functional ligand derived from a varity of materials such as isopropanol, N-butanol, isobutanol, 1,2-dihydroxyisobutane, 2-hydroxy caroxylic acids, such as 2-hydroxypropionic acid, monoesters of ethylene glycol, ethylene glycol and propylene glycol,and X is a functional group such as $-NH_2$, $-COOH$, $-CONH_2$, etc. This type of organozircoaluminate polymers under the trademark CAVCO MOD are available from Cavedon Co., Inc. of Woonsocket, R.I. For illustrative purposes, the following compositions have been utilized for practicing the present invention:

A carboxy functional zircoaluminate polymer (carboxylato-zircoaluminate chloride hydroxide polymer) sold as CAVCO MOD CPM is available as 25% solids in propolene glycol dimethyl ether, and contains 4.3% to 4.8% metal content (both zirconium and aluminum); and An aminofunctional zircoaluminate (amino-zircoaluminate chloride hydroxide polymer) sold as CAVCO MOD APG is available as 25% solids in propolene glycol and contains 4.1% to 4.4% metal content.

In addition to the above two compositions, there are other available compositions sold as CAVCO MOD FPM, CAVECO MOD C-1PM and CAVCO MOD CPG which also function as mask materials to varying degrees according to this invention.

Films were formed and tested utilizing both CAVCO MOD APG and CAVCO MOD CPM to determine their film quality and resistance to $O_2$ RIE and also to RIE conditions typically used for etching into silicon/polysilicon substrates and other inorganic materials such as $SiO_2$, $SiO_x$, silicon nitride, etc. In the case of APG, the as-received formulation was spin applied on silicon wafers at 4,000 to 5,000 RPM for 30 seconds and subjected to a bake-cure cycle of 85° for 20 minutes followed by 150° C. for 30 minutes followed by 230° C. for 30 minutes. In some cases, the films were heated up to 400° C. In the case of CPM, the commercial formulation (40g) was first diluted with 60g of 1-methoxy-2-pro- panol or ispropyl alcohol and then spin applied on organic or inorganic substrates followed by immediate bake-cure as practiced for APG. Without this modification, the material gave poor quality films. According to this procedure excellent quality uniform films varying in thickness from 1600 Å to 3000A (depending upon spin speed) were obtained. Surface chemistry of these 250° C.–400° C. cured films was studied by XPS analysis which provided surface compositions as given in Table I below.

TABLE I

| | Surface Elemental Composition | |
|---|---|---|
| Element | APG Atom % | CPM Atom % |
| $C_{1s}$ | 37.6 | 45.4 |
| $O_{1s}$ | 43.0 | 39.0 |
| $Al_{2p}$ | 17.3 | 12.9 |
| $Zr_{3d}$ | 2.1 | 1.4 |

Additionally, the films formed with APG zircoaluminate were tested for the etch rate ratio (ERR) of the various relevant substrate materials with respect to the zircoaluminate film. The higher the ratio, the better the RIE mask performance of the zircoaluminate films. These together with results obtained in Examples 1 and 2 hereinafter, are shown in Table II below.

TABLE II

| Gas | SCCM (1) | Power (2) | Pressure (3) | Etch Rate of Film (4) | Etch Rate Ratio (5) | | |
|---|---|---|---|---|---|---|---|
| | | | | | Silicon or Polysilicon | $SiO_2$ | $Si_2N_4$ |
| $CF_4$ | 100 | 1000 | 40 | 42 | — | 7 | 9.7 |
| $CF_4/O_2$ | 50/50 | 1000 | 40 | 62 | — | 5 | 10 |
| $CF_4/H_2$ | 50/40 | 1000 | 20 | 88 | — | 3 | — |
| Freon12/Ar | 50/50 | 1000 | 30 | 88 | 8 (Si) | — | — |

TABLE II-continued

| Gas | SCCM (1) | Power (2) | Pressure (3) | Etch Rate of Film (4) | Etch Rate Ratio (5) Silicon or Polysilicon | SiO$_2$ | Si$_2$N$_4$ |
|---|---|---|---|---|---|---|---|
| Freon11/Ar | 23/23 | 300 | 29 | 6.4 | 44(polySi) | 5 | 8 |
| SF$_6$ | 50 | 450 | 20 | 24 | >100 | 10 | — |
| SF$_6$/Freon11 | 75/25 | 450 | 20 |  | 40–50(polySi) |  |  |

(1) Standard Cubic Centimeter
(2) Power in Watts
(3) Pressure in mTorr
(4) Etch Rate of ZrAl film in Å min.
(5) Etch rate of substrate with respect to etch rate of the ZrAl mask layer An examination of Table II shows that with the extremely high etch rate ratio of the silicon and polysilicon with respect to zircoaluminate polymers in SF$_6$ RIE, these polymers are especially useful for deep trench etching of silicon substrates.

The following two examples show typical examples of the invention utilizing two different materials in two different types of etching processes.

EXAMPLE I

Typical Working Example for Use of Zircoaluminate Film as O$_2$ RIE Mask in a Three Layer Process for Metal Patterns The steps described herebelow are shown in FIGS. 2a through 2h. For this application, the zircoaluminate CAVCO MOD CPM was first diluted with 1-methoxy 2-propanol and isopropyl alcohol in the ratio of 40:60. This dilution was performed since the as-received formulation resulted in poor quality films which also were much thicker than desired in the present application. For the layer of organic polymers, a planarizing layer of Shipley AZ-1350J was spin-applied on gamma-aminopropyltriethoxy silane (applied as a 0.1% solution in 95:5 ethanol-water) primed silicon wafers according to conventional practice and baked sequentially at 85° C. for 30 minutes and then 230° C. for 30 minutes to form thermally stable and non-photosensitive organic polymer layer. (Alternatively, a soluble polyimide such as XU218 manufactured by CIBA Geigy can be used.) After this, the zircoaluminate solution (described above) was spin-applied at 4000rpm for 30 seconds and baked at 85° C. for 20–25 minutes and then 230° C. for 30 minutes to form about 2500 Å thick film of zircoaluminate over about 2 microns thick polymer layer. This was followed by spin application of Shipley AZ1350J resist sensitive to mid UV and near UV and baked in an oven at 85° C. for 30 minutes to form about 0.9–1.1 micron film. Imagewise exposure was then carried out on a Perkin-Elmer 200 Exposure tool in a conventional manner and the pattern was developed by immersion in 4.5:1 diluted AZ2401 developer manufactured by Shipley Corp, for 20–25 seconds followed by through rinse in deionized water and blow drying with N$_2$. Both the exposed resist coating and underlying barrier film were patterned in the development step, and hence the resist pattern was transferred through the barrier film exposing the underlying polymer layer for replication of pattern by the O$_2$ RIE step. The exposed underlying organic polymer substrate was O$_2$ RIE etched, the following conditions being employed: 40–50 SCCM O$_2$ flow rate, 60 mTorr pressure and 100 watts RF power. Once the pattern was etched into the polymer underlayer as indicated by the laser end-point-detect method using laser interferometry, etching was continued until 100% beyond end point. This is a common practice in processes for generating overhang or lift-off profiles.

SEM micrographs of sectioned RIE'd pattern showed the desired undercut in the underlying polymer layer and an overhang in the zircoaluminate pattern. SEM micrographs also showed the presence of sputter residue after RIE which was completely removed by 5–10 seconds dip in 7:1 buffered HF followed by deionized water rinse and N$_2$ blow dry. SEM micrograph of sectioned pattern after this step showed residue free images with significant decrease in the overhang caused by removal of some of the zircoaluminate film during the buffered HF cleaning step. This was followed by blanket deposition of 2 microns of Al/Cu according to a standard metallization process involving vacuum evaporation. Lift-off step was accomplished by subjecting the metallized stack to n-methylpyrrolidone (NMP) at 90° C. for about 45 minutes. SEM micrographs of the remaining metal pattern showed clean lines down to 1.5 micron width with no fencing or other defects.

EXAMPLE II

Representative Example of the Use of Zircoaluminate as Mask for Deep Silicon Trench Etching The steps described hereunder are shown in FIGS. 1a through 1d. Zircoaluminate formulation CAVCO MOD APG (as received) was spin applied on silicon wafers at 4000 RPM for 30 seconds and immediately placed in an oven heated to 85° C. After 30 minutes at this temperature, the films were baked at 150° C. for 20 minutes and then 200° C. for 40 minutes and 275° C. for 40 minutes to obtain shiny, uniform and defect-free films of about 2000 Å thickness. (Variable thickness films in 1500–2500 Å range can be obtained by adjusting the spin speed.) A photoresist formulation, Shiply AZ1350J, was then spin applied over the cured APG films and baked at 85° C. for 30 minutes to form about 1 micron thick resist film. This was followed by the standard imagewise expose/develop steps as described in the previous example. The developing of the resist again also patterning through the underlying barrier films to thus simultaneously develop the resist and pattern the underlying zircoaluminate film. After a brief post-bake at 100°–120° C., the pattern was subjected to a brief CF$_4$ RIE clean step and etched into the silicon substrate using SF$_6$ in a standard Reactive Sputter Etcher under the following conditions:

| SF$_6$ Etch Conditions: | 13.56 MHz RF Generator: |
|---|---|
| RF Power - 450 watts | Quartz on Si Pellet |
| Flow - 50 SCCM | 9" Al Can |
| Chamber Pressure - 20 mTorr | |

Under these conditions, Si etch rate was about 0.7 μm/min and etch-rate-ratio of Si:APG film was about 200:1. SEM micrographs of the etched pattern showed about 12 micron deep silicon trench with approximately 1400 Å zircoaluminate film still remaining. As a final step, the remaining film was removed by brief dip in 4.5:1 AZ developer and also in 7:1 buffered HF. Alternatively, the remaining ZrAl film may be kept in place to become integral part of device structure.

Similar results also can be obtained by using other organozircoaluminate polymers and also organozircotitanate polymers wherein the titanium is substituted for the aluminum or organo magnesium or hafnium are substituted for zirconium.

The superior performance of films according to this invention, is believed to be due to the fact that: (a) zirconium has a large atomic radius (1.45 Å) and $Zr^{+4}$ having an ionic radious of 0.75 Å, allows coordination number of 7 to 8, and higher degree of polymerization/state of aggregation and stabilization through solvation effects. This particular characteristic of zirconium, even when the zirconium is present in a relatively small stolchiometric ratios atttributes to stability of the formulations under ambient conditions; (b) zircoaluminate polymers, unlike many other alkoxides have been found insensitive to ambient humidity and thus provided excellent quality coatings as compared e.g. to aluminum ethylacetoacetate-type coatings which demonstrated rapidly developing crazing and cracking; (c) the zircoaluminate polymer can be formulated in polar high boiling point alcohol or ether solvents, which do not undergo rapid evaporation during the spin application and thus are well suited for film formation. The aluminum chelates which are applied from non-polar low boing solvents such as hexane result in film nonuniformity and defects due to rapid solvent evaporation.

Although the invention has been described in some degree of particularity, various adaptations and modifications can be made without departing from the scope of the claims.

What is claimed is:

1. A method of image transfer into a substrate material by reactive ion etch (RIE) technique comprising the steps of,
    selecting a substrate material into which a pattern is to be etched, applying a spin-on film forming mask layer on said substrate material, said mask layer comprising a mixed organometallic polymer selected from the group consisting of organo functional zircoaluminates, organo functional zircotitanates, and organo functional hafniumaluminates, drying and curing said mask film, forming a pattern in said mask to expose the substrate to the pattern to be etched on the substrate, and thereafter reactive ion etching to transfer the mask pattern into said exposed substrate utilizing the remaining portions of the patterned film as a barrier to the reactive ion etching.

2. The method as defined in claim 1, wherein the pattern is formed in said mask by first applying a radiation sensitive resist coating over said mask layer, imagewise exposing said resist film, and thereafter developing the exposed resist pattern with simultaneous removal of said underlying mask in the developed resist areas to form a patterned composite of the resist and said mask.

3. The method as defined in claim 2, wherein said developing is in an aqueous base developer and wherein the mixed metal organometallic RIE mask material is selected to be soluble in said aqueous-base developer used to develop the resist coating, whereby the resist is developed and the mask material is patterned in a single step.

4. The method as defined in claim 3, wherein the developer is selected from the group consisting of aqueous bases and alcoholic bases.

5. The method as defined in claim 1, wherein the pattern is formed in said mask by first applying a radiation sensitive resist coating over said mask layer, imagewise exposing said resist film and then transferring the resist pattern into the mixed-metal organometallic RIE mask in a separate step wherein the resist is first developed in an organic solvent without affecting the underlying mask, and thereafter said mask is patterned to expose the substrate to be etched.

6. The method as defined in claim 5, wherein the developer for the resist layer is an organic solvent and the developer for said mask layer is selected from the group consisting of aqueous bases and alcoholic bases.

7. The method as defined in claim 5 wherein the resist pattern is developed with an organic solvent and said mask layer is patterned by dry etching.

8. The method as defined in claim 1, wherein the substrate material is an organic polymer film in which the pattern is transferred by selective dry etching using a gas selected from the group consisting of oxygen and a mixture of fluorocarbons and oxygen.

9. The method as defined in claim 8, wherein the RIE mask material is an organo-functional zircoaluminate having carboxy functional ligands.

10. The invention as defined in claim 8, wherein the RIE mask material is an organo-functional zircoaluminate, having amino functional ligands.

11. The method as defined in claim 1, wherein the substrate material is selected from the group consisting of silicon, polysilicon, silicon oxide, and silicon nitride, wherein selective reactive ion etching is carried out by using a composition selected from the group consisting of $SF_6$, halogenated hydrocarbons, chloro-fluoro-carbons, fluorocarbons, and mixed fluorocarbons and oxygen and mixtures thereof.

12. The method as defined in claim 1, wherein said mixed metal organometallic polymers are organo-functional zircoaluminates wherein the functional groups are selected from the group consisting of isopropanol, butanol, 1,2-dihydroxyisobutane, carboxylic acids, hydroxy caroxylic acids, amino acids, glycols, monoesters of glycols, and diesters of glycols.

* * * * *